United States Patent
Kyranas et al.

(10) Patent No.: US 7,890,069 B2
(45) Date of Patent: Feb. 15, 2011

(54) SELECTABLE LOW NOISE AMPLIFIER FOR WIRELESS COMMUNICATION

(75) Inventors: Aristeidis I. Kyranas, Zografou (GR); Georgios S. Kamoulakos, Athens (GR); Iason F. Vassilou, Athens (GR); Konstantinos D. Vavelidis, Ilioupolis (GR)

(73) Assignee: Broadcom Corporation, Irvine, CA (US)

( * ) Notice: Subject to any disclaimer, the term of this patent is extended or adjusted under 35 U.S.C. 154(b) by 661 days.

(21) Appl. No.: 11/937,990

(22) Filed: Nov. 9, 2007

(65) Prior Publication Data

US 2009/0124223 A1 May 14, 2009

(51) Int. Cl.
*H03D 9/06* (2006.01)

(52) U.S. Cl. ..................... 455/141; 455/143

(58) Field of Classification Search ............... 455/130, 455/140, 142, 143, 232.1, 253.1, 253.2, 254, 455/323, 333, 141
See application file for complete search history.

(56) References Cited

U.S. PATENT DOCUMENTS

| | | | |
|---|---|---|---|
| 7,098,742 B2 * | 8/2006 | Johnson | 330/301 |
| 2006/0094357 A1 * | 5/2006 | McCorkle | 455/41.2 |
| 2007/0064843 A1 | 3/2007 | Vavelidis et al. | |
| 2007/0066271 A1 | 3/2007 | Vavelidis et al. | |
| 2007/0066272 A1 | 3/2007 | Vassiliou et al. | |
| 2007/0207759 A1 | 9/2007 | Vavelidis et al. | |
| 2010/0144304 A1 * | 6/2010 | Lin et al. | 455/333 |

* cited by examiner

*Primary Examiner*—Thanh C Le
(74) *Attorney, Agent, or Firm*—Garlick Harrison & Markison

(57) ABSTRACT

A low-noise amplifier in a receiver has a differential mode of operation and at least one single-ended mode of operation. A control signal is used to select between or among the modes and the switching between differential and single-ended operations may be performed on the fly.

15 Claims, 5 Drawing Sheets

| Diff mode | S1A CLOSED | S1B OPEN | S3 CLOSED | S2 OPEN |
|---|---|---|---|---|
| SE mode #1 Lprimary=L1 | S1A OPEN | S1B CLOSED | S3 CLOSED | S2 CLOSED |
| SE mode #2 Lprimary=L1+L2 | S1A OPEN | S1B CLOSED | S3 OPEN | S2 CLOSED |

FIG. 5

SELECTABLE LOW NOISE AMPLIFIER FOR WIRELESS COMMUNICATION

BACKGROUND OF THE INVENTION

1. Technical Field of the Invention

The present invention relates generally to wireless communication systems and, more particularly, to low noise amplifiers in such wireless communication systems.

2. Description of Related Art

Mobile communication has changed the way people communicate and mobile phones have been transformed from a luxury item to an essential part of every day life. The use of mobile phones today is generally dictated by social situations, rather than being hampered by location or technology. While voice connections fulfill the basic need to communicate, and mobile voice connections continue to filter even further into the fabric of every day life, the mobile Internet and moving video, including broadcast video, are the next steps in the mobile communication revolution. The mobile Internet is poised to become a common source of everyday information, and easy, versatile mobile access to this data will be taken for granted. Similarly, video transmissions to handheld user equipment will allow movies and television programs to be viewed on the go.

Third generation (3G) cellular networks have been specifically designed to fulfill many, if not all, of these future demands. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers want technologies that will allow them to increase downlink throughput and, in turn, offer advanced QoS capabilities and speeds that rival those delivered by cable modem and/or DSL service providers. In this regard, networks based on Wideband Code Division Multiple Access (WCDMA) technology may make the delivery of data to end users a more feasible option for today's wireless carriers.

The General Packet Radio Service (GPRS) and Enhanced Data rates for GSM (EDGE) technologies may be utilized for enhancing the data throughput of present second generation (2G) systems such as GSM. The Global System for Mobile telecommunications (GSM) technology may support data rates of up to 14.4 kilobits per second (Kbps), while the GPRS technology may support data rates of up to 115 Kbps by allowing up to 8 data time slots per time division multiple access (TDMA) frame. The GSM technology, by contrast, may allow one data time slot per TDMA frame. The EDGE technology may support data rates of up to 384 Kbps. The EDGE technology may utilizes 8 phase shift keying (8-PSK) modulation for providing higher data rates than those that may be achieved by GPRS technology. The GPRS and EDGE technologies may be referred to as "2.5G" technologies.

The Universal Mobile Telecommunications System (UMTS) technology with theoretical data rates as high as 2 Mbps, is an adaptation of the WCDMA 3G system by GSM. One reason for the high data rates that may be achieved by UMTS technology stems from the 5 MHz WCDMA channel bandwidths versus the 200 KHz GSM channel bandwidths. The High Speed Downlink Packet Access (HSDPA) technology is an Internet protocol (IP) based service, oriented for data communications, which adapts WCDMA to support data transfer rates on the order of 10 megabits per second (Mbits/s). Developed by the 3G Partnership Project (3GPP) group, the HSDPA technology achieves higher data rates through a plurality of methods.

Where HSDPA is a downlink protocol, High Speed Uplink Packet Access (HSUPA) technology addresses the uplink communication. HSUPA is also specified by the 3GPP group to provide a complement data link to HSDPA. HSUPA also offers broadband IP and is based on software. HSUPA also extends the WCDMA bit rates, but the uplink rates may be less than the downlink rates of HSDPA. Where prior protocols severely limited the uplink connections, HSUPA allows for much higher uplink rates.

Likewise, standards for Digital Terrestrial Television Broadcasting (DTTB) provide for transmission of broadcast video. Three leading DTTB systems are the Advanced Television Systems Committee (ATSC) system, the Integrated Services Digital Broadcasting-Terrestrial (ISDB-T) system, and the Digital Video Broadcasting (DVB) system, which includes terrestrial transmission under Digital Video Broadcasting-Terrestrial (DVB-T) specifications and transmissions to handheld devices under Digital Video Broadcasting-Handheld (DVB-H) specifications. DVB-H is an adaptation of DVB-T to handheld units, in which additional features are implemented to meet specific requirements of handheld units. DVB-H allows downlink channels with high data rates and may be made as enhancements to current mobile wireless networks. DVB-H may use time slicing technology to reduce power consumption of handheld devices.

A number of constraints are encountered with mobile units, so that systems (such as DVB-H) that communicate with mobile units typically need to address these constraints. Mobile users with small handheld units are difficult to target and the environment is constantly changing as the user's physical location changes. For example, a user may move from one cell sector to another. For the system, the number of users in a given broadcast area, such as a cell sector, may change considerably. Since most handheld devices are battery powered, power consumption in the handheld unit is a significant concern. Accordingly, in the design of handheld units, it would be advantageous to consider some of these constraints for receiving transmitted signals, such as DVB-H signals.

For a wireless communication device to participate in wireless communications, it typically includes a built-in radio transceiver (i.e., receiver and transmitter) or is coupled to an associated radio transceiver (e.g., a station for in-home and/or in-building wireless communication networks, RF modem, etc.). The transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with a local oscillator signal to produce radio frequency (RF) signals. The power amplifier amplifies the RF signals prior to transmission via an antenna.

In some instances where two-way communication is not necessary, the wireless communication device may only contain a receiver to receive signals. A handheld device, such as that used for reception of broadcast radio (AM/FM) or television, may not need the two-way communication. Hence, for reception only, the wireless device need only have a receiver to receive the broadcast signal. Accordingly, a DVB-H handheld device, may only have a receiver in the device.

The receiver is coupled to an antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with a local oscillator signal to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

One of the common components in a receiver RF front end is the low noise amplifier (LNA). Because the received RF signal is weak, LNA is used to boost (amplify) the signal without introducing appreciable additional noise. General communications receiver technology involves the use of a LNA for a particular RF front end. However, as integration increases to place more circuitry onto a single integrated circuit chip (system-on-chip or SoC) and such SoC components are placed into small handheld devices, a more robust LNA designs may be needed. For example, increased integration of RF along with digital processor circuitry in SoCs, increases noise and interference levels in the RF systems. Therefore, increased levels of noise immunity may be required from the RF part of the SoC to provide the required performance.

To increase noise immunity, typical integrated LNAs (and for that matter all analog and RF circuits in an integrated receiver) are differential, i.e. the input is applied as a differential signal and all inputs and outputs are also differential signals. Since typical antennas in communication systems are single-ended, either internal or external single-ended to differential conversion subcircuits are used, which can be either passive or active circuits. External passive single-ended to differential transformers have the advantage of better performance but add cost and size to the receiver implementation. Topologies where the LNA has a single-ended input and differential output avoid using external components, but depending on the environment, they could be prone to performance degradation due to noise (for example, operation in a device attached to a PC). Noise from neighboring devices at the input of a differential LNA is usually applied at both the P and N pins of the differential input, thus being cancelled by the common mode rejection of the differential amplifier. In single-ended input LNAs this mechanism does not exist, thus noise at the input can be detrimental.

Accordingly, there exists the need for a re-configurable LNA which, depending on the environment, can operate either as single-ended or differential. The selection between the two modes may be done in software and possibly using different external matching components. In addition, there are situations where the desired input signal power is high enough and the performance of a differential LNA is not necessarily needed. In that case a single-ended LNA may have adequate performance, as well as the advantage of lower power consumption. It would be beneficial, especially from the power consumption point of view, to have a receiver that can dynamically use either a single-ended or a differential LNA, which may be made depend on the overall receiver performance.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

BRIEF DESCRIPTION OF THE DRAWINGS

FIG. 5 shows switch operations for the circuit of FIG. 4 to implement the modes of operations noted in FIG. 3A or FIG. 3B.

DETAILED DESCRIPTION OF THE EMBODIMENTS OF THE INVENTION

The embodiments of the present invention may be practiced in a variety of settings that utilize a wireless communication receiver. The specific embodiments described below pertain to a LNA used at a RF front end of a downlink receiver for receiving broadcast signals, such as DVB-H. However, the invention need not be limited to such applications and different embodiments of the invention may be implemented in other circuitry and applications.

Figure 1:
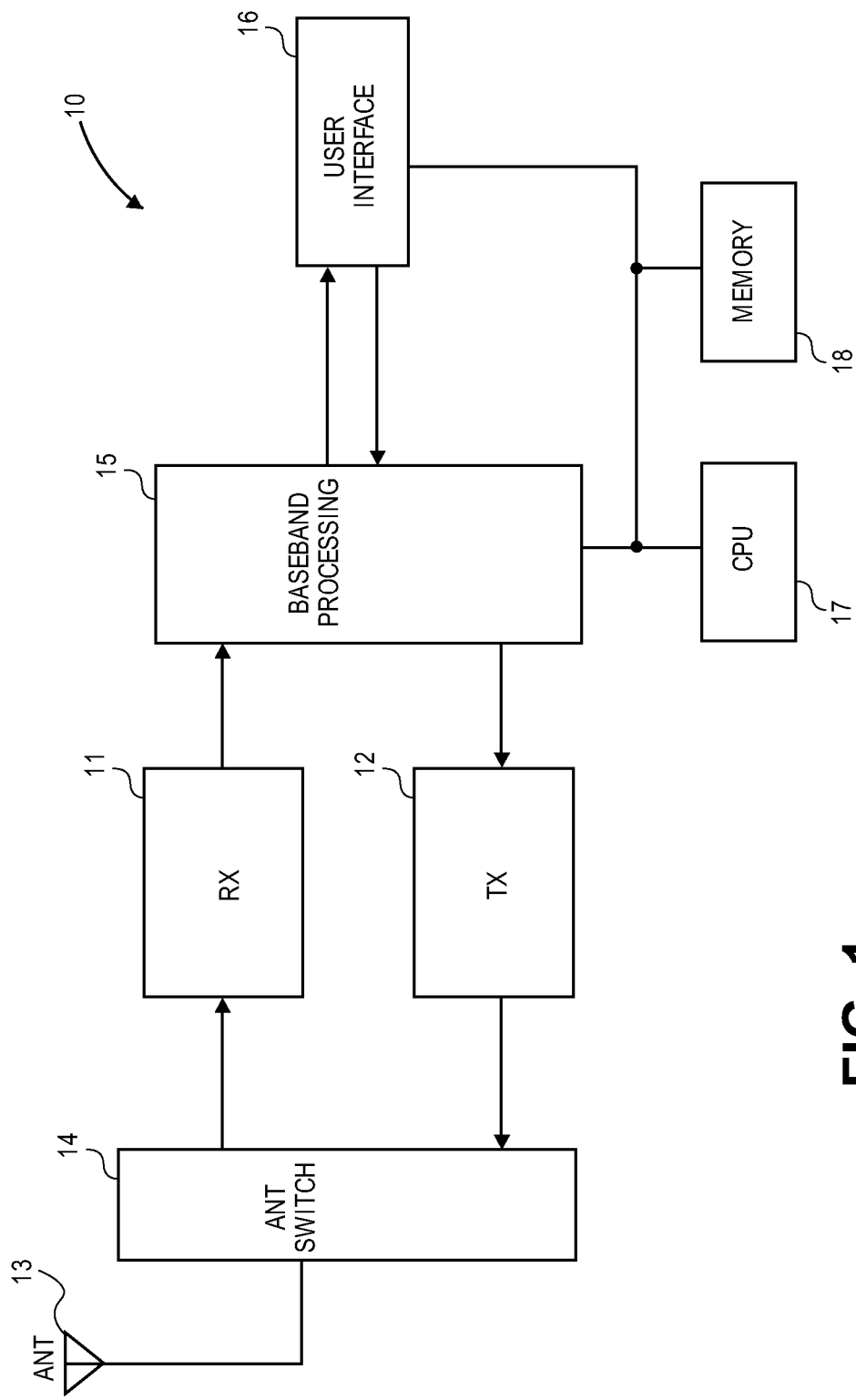
FIG. 1 is a block diagram showing an exemplary downlink device used in a wireless communication system.

FIG. 1 shows a downlink wireless device 10 which is used in a wireless communication system. Device 10 may be used as a user terminal or user equipment (UE) for communicating with an uplink device. Device 10 may be a cell phone for receiving and sending audio communication and/or text messaging. Device 10 may also send and receive packet traffic for communications through the Internet, or some other network. Device 10 may also send and receive video data. In other instances, device 10 may receive moving video and/or broadcast transmissions, such as broadcast television. What is to be noted is that device 10 may operate to receive a variety of signals transmitted from an uplink device, and the received signal depends on the particular environment of the communication system that device 10 operates in. Thus, device 10 may be a cell phone or some other handheld device that is operated by a user.

Device 10 includes a receiver 11 and transmitter 12 which are coupled to an antenna 13, via switch 14. Switch 14 may take many forms and may implement different radio frequency (RF) switching technology. Switch 14 may include transmit/receive (T/R) switching circuitry and/or duplexers. What is important is that some form of switching is implemented between antenna 13 and the RF front end of device 10. In some instances antenna 13 may comprise multiple antennas. Receiver 11 includes suitable circuitry to receive and convert received RF signals to baseband signals. Likewise, transmitter 12 includes suitable circuitry to convert baseband transmit signals to RF signals for transmission from antenna 13.

Device 10 also includes a baseband processing module 15 and user interface 16. Baseband processing module 15 is coupled to receiver 11 to process the converted signals from receiver 11 and to provide an output to the user of the device through interface 16. Similarly, user inputs at interface 16 are coupled to baseband processing module 15 and signals for transmission are coupled to transmitter 12. User interface 16 may take various forms including, but not limited to, a video display, keyboard, microphone, headphones and/or speakers. Baseband processing module generally performs baseband operations in signal processing for received signals and likewise for signals to be transmitted.

Device 10 may also include a general (or host) processor 17 to control various processing operations of device 10, including control functions for interface 16 and baseband processing module 15. Processor 17, in some applications, is referred to as a Central Processing Unit (CPU). A memory component 18, which may be an internal memory or an add-on memory, may be included to operate with processor 17. Processor 17 is shown coupled to baseband processing module 15 and user interface 16, but other connections are possible to various components of device 10 in other embodiments.

As noted above, one application of device 10 is to operate as a downlink receiver for receiving broadcast transmissions. In one embodiment, device 10 is operated as a handheld terminal in a communication link for receiving broadcast transmissions. In particular, device 10 operates within a cellular environment for receiving DVB-H transmissions. However, in other embodiments, device 10 may be designed to operate in other communication systems.

Figure 2:
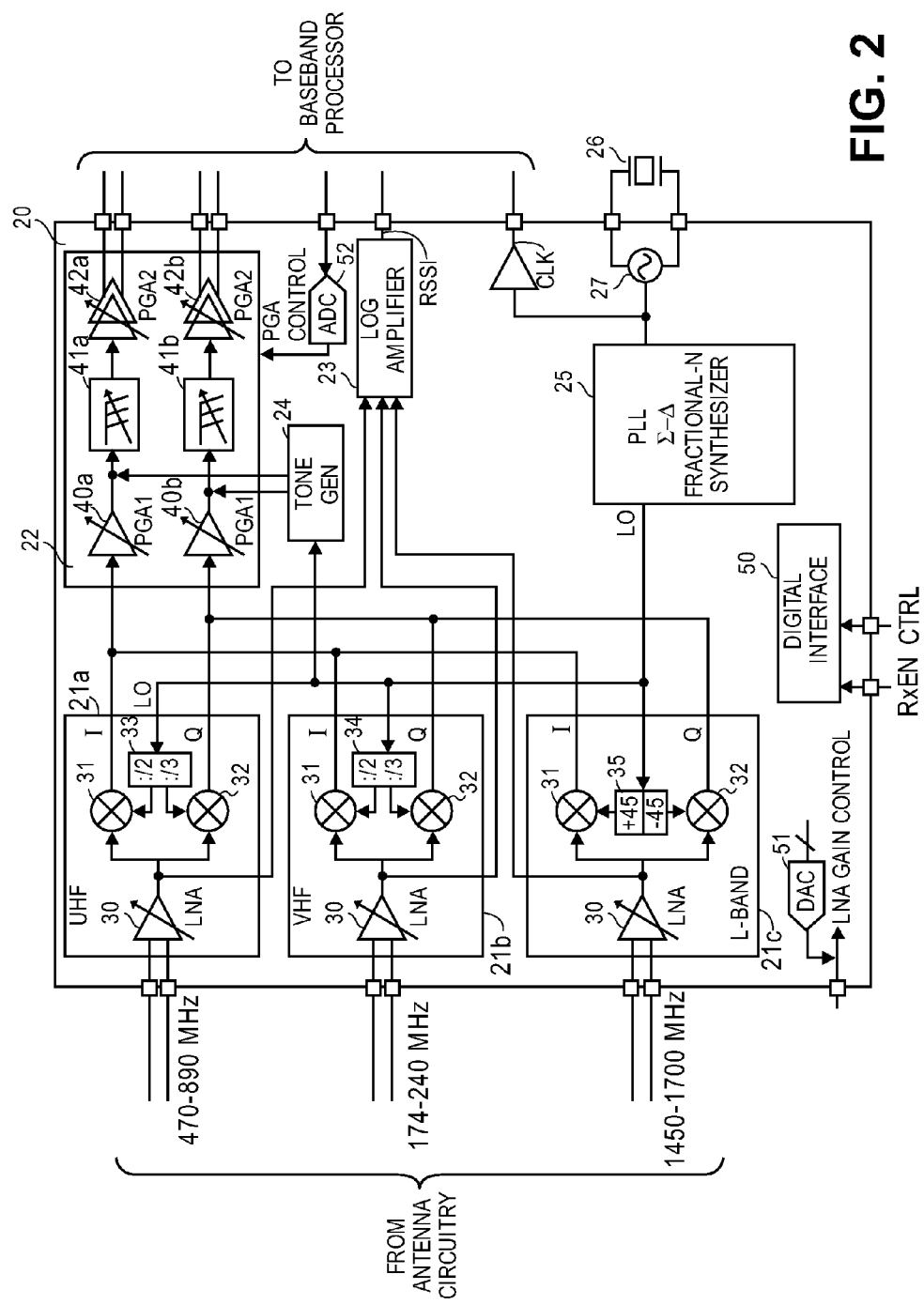
FIG. 2 is a block diagram of a receiver portion of a downlink wireless device that includes multiple RF front ends according to one embodiment of the invention.

Although a variety of receivers may be implemented for receiver 11, one particular embodiment is illustrated in FIG. 2. FIG. 2 shows a single-chip multiple-band RF receiver 20, in which the receiver components are formed on a single integrated circuit (IC) chip. The exemplary single-chip RF receiver 20 has multi-band capability. Receiver 20 has separate RF front-ends for each of the frequency bands that it is capable of receiving. In the particular embodiment, receiver 20 has three front-ends to receive analog signal inputs at UHF, VHF and L-band range of frequencies. A UHF front-end 21a processes RF signals in the approximate frequency range of 470-890 MHz. A VHF front-end 21b processes RF signals in the approximate frequency range of 174-240 MHz. A L-band front-end 21c processes RF signals in the approximate frequency range of 1450-1700 MHz. The selection of the frequency of the signal being coupled to each of the front-ends is achieved by a tuning circuit at the antenna or within the antenna switch.

Receiver 20 also includes a filter/amplifier module 22, a logarithmic amplifier 23 a tone generator 24 and a Phase-Lock Loop frequency synthesizer (PLL). PLL 25, which is a Σ-Δ (sigma-delta) fractional-N synthesizer in this embodiment, is used to generate a local oscillator (LO) signal. The LO signal from PLL 25 is coupled to each of the front-ends 21. A reference crystal 26 is used to generate a reference clock signal (CLK) from oscillator 27 that is used as a reference clock input to PLL 25. The reference clock signal CLK is also provided as an output from receiver 20.

Each front-end 21 includes a low-noise amplifier (LNA) 30, in-phase (I) mixer 31 and a quadrature (Q) mixer 32. LNA 30 is a variable gain LNA with programmable gain control. In other embodiments, LNA 30 may have a fixed gain. LNA gain may be controlled from off-chip or from a LNA gain control circuit that is on-chip (not shown). The illustrated LNA gain control signal is coupled to LNA 30 to control the gain of LNA 30. Digital-to-analog (DAC) converter 51 is used to convert the control signal to analog form, if the control signal is in digital form. As will be noted in reference to FIG. 4, an analog LNA gain control signal is used at the gates of the gain controlling transistors. Other embodiments may use a digital LNA gain control signal. Each LNA 30 may be controlled separately or in unison by the LNA gain control signal. The output of each LNA is coupled to respective I and Q mixers 31, 32 for down conversion of the respective RF signals.

In UHF front-end 21a, a divider and phase-shift module 33 receives the LO signal from PLL 25 and divides the frequency by a factor of 2 or 3, as well as providing the 90 degree phase-shift between the LO I and LO Q components. A factor of 3 division by module 33 is used for UHF signals of around 600 MHZ and below, while a factor of 2 division is used for UHF signals of around 600 MHz or above. With these frequency divisions of the LO signal, PLL 25 generates an LO output of approximately 1.2-1.8 GHz in order to cover the 470-890 MHz UHF range.

In VHF front-end 21b, a divider and phase-shift module 34 receives the LO signal from PLL 25 and divides the frequency by a factor of 6 or 8, as well as providing the 90 degree phase-shift between the LO I and LO Q components. A factor of 8 division by module 34 is used for VHF signals of around 200 MHZ and below, while a factor of 6 division is used for VHF signals of around 200 MHz or above.

In L-band front-end 21c, no frequency division is needed for the LO signal in the approximate 1.2-1.8 GHz range. A phase-shift module 35 receives the LO signal from PLL 25 and provides the 90 degree phase-shift (+45 and −45 shifts) between the LO I and LO Q components.

The respective down converted I and Q signal outputs from mixers 31, 32 are coupled to filter/amplifier module 22. For each I and Q signal component leg, module 22 includes a first programmable gain amplifier (PGA1) stage 40a, 40b; filter 41a, 41b; and a second programmable gain amplifier (PGA2) stage 42a, 42b. In this embodiment, both PGA1 and PGA2 stages have programmable gain, but in other embodiments one or both stages may have fixed gain. Two PGA stages are shown in FIG. 2, but in other embodiments, only one stage or more than two stages may be present. A PGA control signal is used to control the gain of PGA1 and PGA2 stages, either together or separately. In the shown embodiment, the PGA control signal is a digital signal and when needed, the control signal is coupled through an analog-to-digital converter (ADC) 52.

Filters 41a, 41b reside between the two PGA stages and may comprise a variety of filters. For example, filter 41 may be a Nth order lowpass Chebyschev filter to pass a desired band of frequencies. In one embodiment for DVB-H operation, filter 41 response may be set to support channel bandwidths of approximately 5-8 MHz. The output of PGA2 stages are then sent to the baseband processor.

In the particular embodiment of receiver 20, outputs from LNAs 30 are coupled to log amplifier 23 to generate a Received Signal Strength Indication (RSSI). The RSSI signal is used to control the gain of LNAs and/or the PGA stage(s). Furthermore, in this particular embodiment for receiver 20, tone generator 24 also receives the LO signal. Tone generator 24 provides a fixed frequency signal to the filter input in order to calibrate the filter response to the desired cut-off frequency. Tone generator 24 divides the PLL frequency with an appropriate division so that the divided frequency is equal to the desired filter cutoff frequency.

Digital interface 50 is present within receiver 20 to provide an interface from off-chip components. Control signals (noted as CTRL) coupled to interface 50 are used to control one or more functions within receiver 20. For example, the mode switching of the LNAs described below may be controlled by one or more bits of CTRL signal, which is input to receiver 20 via interface 50. A Receiver Enable signal RxEN may be present to activate receiver 20 during receive modes of operation.

The multi-band RF receiver 20 is shown fabricated on a single IC chip. In FIG. 2, the open square boxes along the periphery of receiver 20 indicate chip pads for communicating with circuitry external to the chip. However, in other embodiments, receiver 20 may be fabricated on an IC along with baseband processor 15 or even other components noted in FIG. 1. Such integrated systems are referred to as a System on Chip (SoC). Furthermore, although other manufacturing processes may be used, in one embodiment, receiver 20 is fabricated using any of a plurality of complementary metal-oxide semiconductor processes etc.

It is to be noted that receiver 20 may be utilized in a variety of communication systems that employ various communication standards or protocols. As noted, one use for receiver 20 is to receive DVB-H transmissions from an uplink device. The frequency bands of reception for receiver 20 depend on the type and number of RF front-ends present in the receiver. The LNA of each front-end plays an important role in amplifying the received RF. Accordingly, a robust LNA with selectable configuration for the LNA allows multiple modes of operation for the LNA.

Figure 3A:
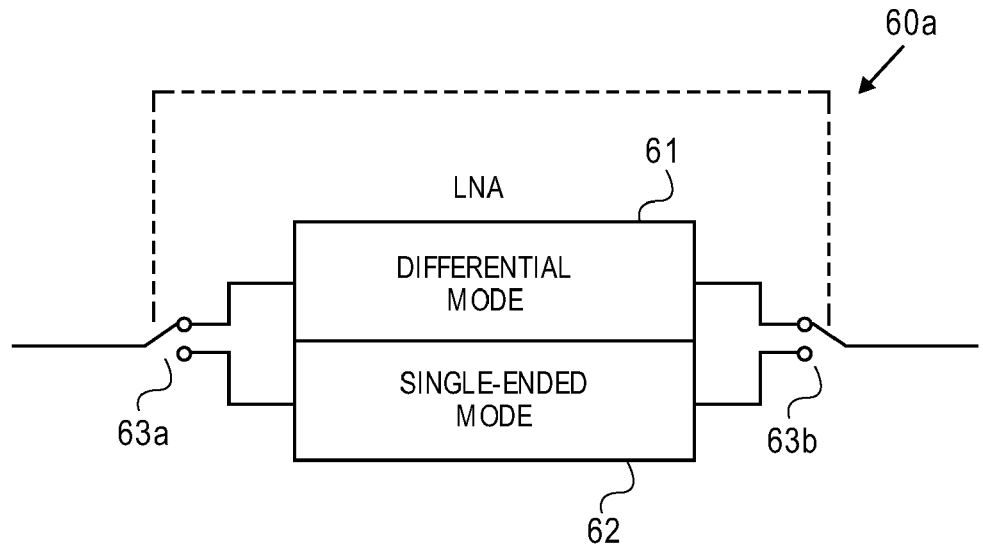
FIG. 3A is a block diagram showing one embodiment of a LNA for practicing the invention, in which the LNA is switched between a differential mode of operation and a single-ended mode of operation.

FIG. 3A shows a LNA 60a, which may be used for LNAs 30 of FIG. 2. LNA 60a has functional circuitry to operate in two separate modes. When switches 63a and 63b are in a first position, LNA 60a is configured to operate in a differential mode 61. However, when switches 63a and 63b are in a second position, LNA 60a is configured to operate in a single-ended mode 62. In differential mode 60, LNA 60a receives the RF input signal and outputs a differential signal to the following stage, which is a mixer in receiver 20. In single-ended mode, LNA 60a receives the RF input signal and outputs either a single-ended or differential signal to the following stage. Switches 63a and 63b may be ganged, as shown, or they may operate independently.

Figure 3B:
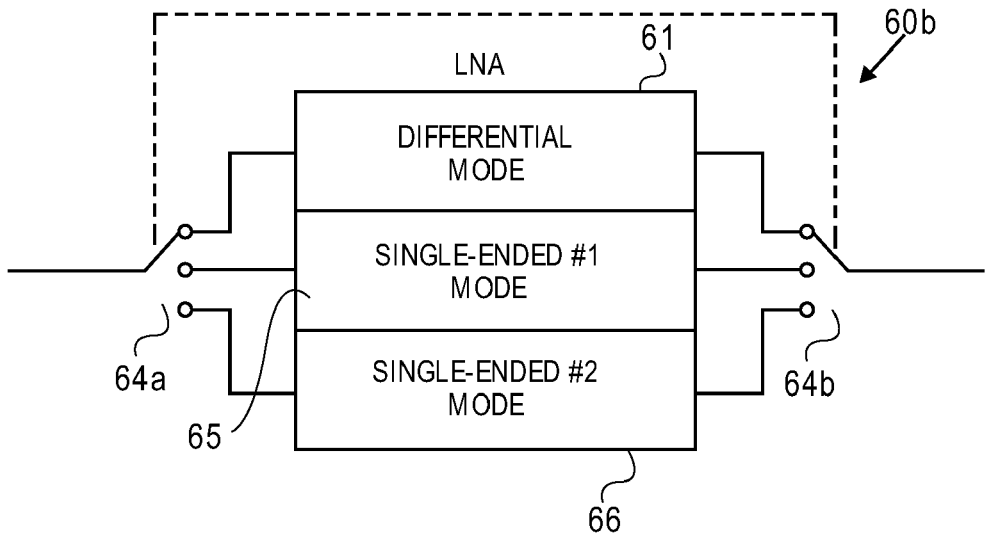
FIG. 3B is a block diagram showing another embodiment of a LNA for practicing the invention, in which the LNA is switched among a differential mode of operation and two single-ended modes of operation.

A variation of LNA 60a is shown in an alternative embodiment of FIG. 3B. In FIG. 3B, LNA 30b still may be configured to operate in the differential mode 61. However, instead of just one single-ended mode, LNA 60B has a first single-ended mode 65 and a second single-ended mode 66. Switches 64a and 64b provide the switching among the three modes. It is to be noted that other embodiments may have additional single-ended modes and/or additional differential modes. What is to be noted is that the LNA has at least one differential mode of operation and at least one single-ended mode of operation.

Figure 4:
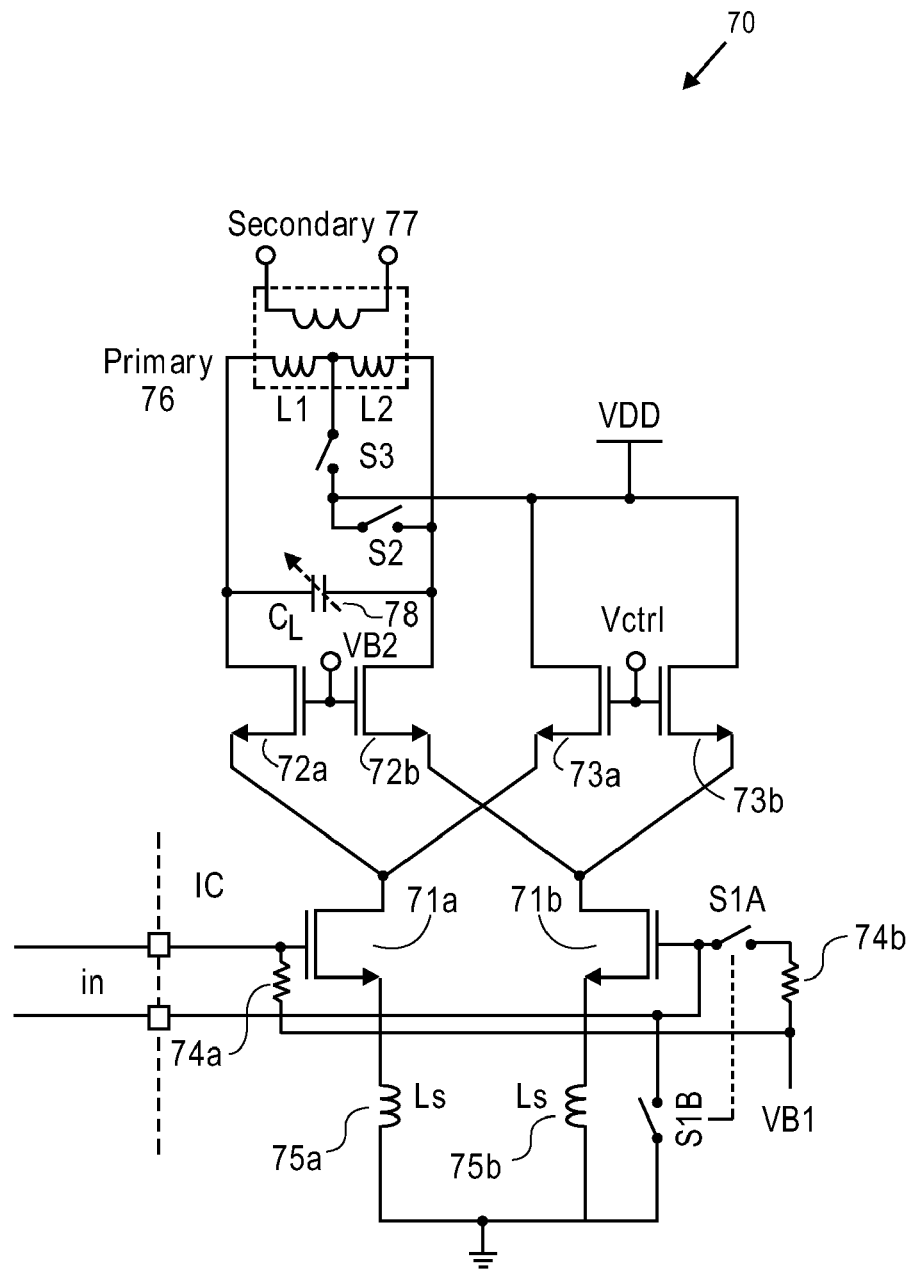
FIG. 4 is a circuit diagram showing one embodiment for implementing the LNA of FIG. 3A or FIG. 3B.

Although various circuitry may be implemented to provide the selectable LNA of FIG. 3A or FIG. 3B, FIG. 4 illustrates one embodiment of the invention. LNA 70 includes a pair of input transistors 71a, 71b arranged differentially and the gates of transistors 71a, 71b are coupled to the RF input pads of the IC to receive the RF signal from the antenna circuitry. The gates of transistors 71a, 71b are biased by a bias voltage VB1 through resistors 74a, 74b, respectively. The sources of transistors 71a, 71b are coupled to a supply return (ground in this instance) through a source inductance Ls, shown as inductors 75a, 75b, respectively. In some embodiments, inductors 75a, 75b are not present, while in other embodiments, other components may be present. Switch S1A, when closed, couples the gate of transistor 71b to receive the bias voltage. Switch S1B when closed couples the gate of transistor 71b to ground. Switches S1A and S1B may be ganged or may operate independently. As described below and shown in the switch configuration chart 80 of FIG. 5, when switch S1A is open, S1B is closed. Likewise, when switch S1A is closed, switch S1B is open.

LNA 70 also includes transistors 72a, 72b and transistors 73a, 73b. Transistors 72a and 73a are coupled to transistor 71a, in which transistor 71a and transistor 72a form a series leg and transistor 71a and transistor 73a form a second series leg. A similar series pairing is achieved with transistors 71b and 72b, as well as with the combination of transistors 71b and 73b. The gates of transistors 72a and 72b are coupled together and to a second bias voltage VB2, which bias voltage biases transistors 72a, 72b. Inductor 76 and capacitor 78 form a load coupled across the drains of transistors 72a, 72b, so that transistors 72a, 72b are used to drive the load. Transistors 73a, 73b are current drive transistors to control the current flow through transistors 71a and 72a, 71b and 72b, respectively. The gates of transistors 73a and 73b are coupled together and to a control voltage $V_{CTRL}$. In one embodiment, the LNA gain control signal is used as $V_{CTRL}$ to control the current flow and, hence, to control the gain of LNA 70.

A load is provided by primary inductor 76 and capacitor 78. Capacitor 78 is either variable of fixed and provides capacitance $C_L$. The primary inductance L1/L2 of inductor 76 and capacitance $C_L$ form a resonant tank circuit and the output is coupled to a secondary winding 77. Inductors 76 and 77 form a transformer that may be either on-chip or off-chip. Inductor 76 has a tap terminal between two end terminals of inductor 76, in which L1 designates the inductance value on one side of the tap and inductance value L2 designates the inductance value on the opposite side of the tap. The tap may be a center-tap for the primary winding, but it need not necessarily be a so.

As noted in FIG. 4, primary inductor 76, as well as capacitor 78, reside across the drains of transistors 72a and 72b. The drains of transistors 73a, 73b are coupled to a supply voltage $V_{DD}$. $V_{DD}$ is coupled to the end terminal of inductor 76 on the L2 side and to the drain of transistor 72b through switch S2. $V_{DD}$ is also coupled to the tap of inductor 76 through switch S3. The operation of the various switches S1A, S1B, S2 and S3 and their effect on LNA 70 may be better understood by viewing configuration chart 80 of FIG. 5.

Configuration chart 80 shows three modes of operation, which may be obtained by selecting "Open" or "Closed" for each of the switches. Although the noted switches S1A, S1B, S2 and S3 may be implemented by a variety of devices, in one embodiment these switches are implemented by transistors. Thus, an open switch state may be obtained by having a transistor in an "off" state and a closed switch state may be obtained by having the transistor in an "on" state, so that open and closed states respectively correspond to non-conduct and conduct states of the switch transistors. When LNA 70 is to operate in the differential mode, S1A is closed, S1B is open, S3 is closed and S2 is open. Having S1A closed and S1B open places both transistors 71a, 71b in a differential configuration to receive the RF inputs as differential inputs. Having S3 closed and S2 open places $V_{DD}$ to the winding tap and drains of transistors 72a, 72b are coupled across inductor 76. In the differential mode, all six transistors are operational and the inductance L1 and inductance L2 provide a differential load.

The next selectable mode is the first single-ended mode. In this instance, S1A is open and S1B is closed, which causes the gate of transistor 71b to be coupled to ground, effectively shutting off transistor 71b and reducing the power consumption. By shutting off transistor 71b, transistors 72b and 73b also shut off, due to the serial connection with transistor 71b. Only transistors 71a, 72a, 73a are operational, thereby providing only a single-ended signal amplification to one input of the RF signal pair. In the SE #1 mode, both S2 and S3 are closed, effectively shorting out L2, so that the only inductance in the drain circuit of transistor 72b is L1. $V_{DD}$ is provided to the tap with S3 closed. Therefore, in SE #1 mode only L1 provides the primary inductance.

The second single-ended mode (SE #2), operates with only transistors 71a, 72a, 73a operational, since the states of switches S1A, S1B shuts off transistors 71b, 72b, 73b. However, in SE #2, S3 is open and S2 is closed, so that $V_{DD}$ is now applied to the end of inductor 76 so that both L1 and L2 are serially configured in the drain circuit of transistor 72b. Thus, in the SE #2 mode, the primary inductance is L1+L2.

It is to be noted that by selectively controlling the switch positions, LNA 70 may operate in a differential mode of operation or one of two single-ended modes of operation. In other embodiments, LNA 70 may be configured to have a differential mode and one single-ended mode (such as SE mode L1+L2). The selection as to which mode to place LNA 70 may be controlled by an internal signal or an external signal to receiver 20. In one embodiment, bit or bits of CTRL signal input to interface 50 of receiver 20 selects the desired LNA mode. Furthermore, the gain of LNA 70 may be controlled by the LNA gain control signal of FIG. 2, which may be coupled as $V_{CTRL}$ to the gates of transistors 73a, 73b. Other designs may be implemented in other embodiments.

It is to be noted that in other embodiments, there may be multiple differential modes of operation to one or more modes of single-ended operation. Thus, the invention is not limited to a given number of differential and/or modes of operation.

A number of advantages may be derived from selecting between differential and single-ended modes of operations for the LNA. Since one LNA circuitry is used for both differential and single-ended operations, external matching components and power consumption reduction are obtained over having two separate circuitry, differential and single-ended. With a single antenna implementation, both RF inputs to the LNA may be used for differential operation, but only one of the RF inputs is used for single-ended operation. As noted above, more than one single-ended mode of operation may be configured for the LNA. The example circuit of FIG. 4 shows two single-ended modes, in which each has a different inductor load value at the output of the LNA. Either of the two modes may be used for the one single-ended mode. Alternatively, both may be used so that there are two single-ended modes. The selectability may be performed at initialization, such as at start-up, or switched dynamically during usage of the receiver, so that the LNA may change the mode of operation on-the-fly. Such selection of the modes may be achieved through programmability (such as by programmable bit(s) of the CTRL signal at interface 50). For example, the receiver may operate in single-ended mode to conserve power, but when higher receiver performance is desired, the LNA may be switched into the differential mode of operation. It then may return to the lower power consumption, single-ended mode when high performance in no longer needed.

Furthermore, the LNA may be adapted to operate as two single-ended amplifiers when two antenna inputs are present. Signals from each antenna may be coupled as single inputs to the pair of input lines of the LNA and both transistor legs of the differential configuration may be made active, each amplifying a respective single-ended input. In this instance another pair of ganged switches S4A and S4B (similar to S1A and S1B) would be used at the input of transistor 71a of FIG. 4. It is to be noted that these are just some of the advantages that may be obtained, along with other advantages that are not noted herein.

Accordingly, a selectable LNA is described. The described LNA may be implemented in a variety of circuitry and in one embodiment, the selectable LNA is used in a front-end(s) of a receiver. Thus, each of the multiple front-ends of the receiver in FIG. 2 may implement the selectable LNA. Furthermore, in one embodiment, the receiver is utilized to receive DVB-H transmissions. Additionally, as noted, the LNA may be incorporated in a receiver that is fabricated on a single integrated circuit, which may or may not incorporate a baseband processor. In regards to the circuit of FIG. 4, the shown transistors are NMOS transistors. However, an equivalent circuit may be designed using PMOS transistors or a combination of NMOS/PMOS transistors. Likewise, other transistor technologies, such as bipolar or Gallium Arsenide (GaAs) may readily implement embodiments of the LNA described above.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items.

Furthermore, the term "module" is used herein to describe a functional block and may represent hardware, software, firmware, etc., without limitation to its structure. A "module" may be a circuit, integrated circuit chip or chips, assembly or other component configurations. Accordingly, a "processing module" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions and such processing device may have accompanying memory. A "module" may also be software or software operating in conjunction with hardware.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. Similarly, flow diagram blocks and methods of practicing the embodiments of the invention may also have been arbitrarily defined herein to illustrate certain significant functionality. To the extent used, the flow diagram block boundaries and methods could have been defined otherwise and still perform the certain significant functionality. Such alternate definitions of functional building blocks, flow diagram blocks and methods are thus within the scope and spirit of the claimed embodiments of the invention. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. An apparatus comprising:
a low-noise amplifier (LNA) circuit to provide differential amplification of an input signal and also to provide single-ended amplification of the input signal; and
a switching circuit coupled to the LNA circuit to switch modes of operation between the differential amplification and single-ended amplification, wherein switching between the two modes of operation is controlled by a programmable control signal to programmably select between the differential amplification and the single-ended amplification dynamically during use, in which the single-ended amplification is used for power conservation and the differential amplification is used for higher performance.

2. The apparatus of claim 1 wherein the LNA circuit is to receive DVB-H transmitted signals.

3. The apparatus of claim 1 wherein the LNA circuit has more than one single-ended mode of amplification.

4. An apparatus comprising:
a first transistor having its gate coupled to a first input;
a second transistor having its gate coupled to a second input and in which the first and second transistors are disposed to operate differentially to amplify signals on the first and second inputs;
a third transistor coupled serially between the first transistor and one terminal of an inductive load;
a fourth transistor coupled serially between the second transistor and a second terminal of the inductive load;
a first switch coupled to a gate of the second transistor to activate the second and fourth transistors during a differential mode of operation to differentially amplify signals on both the first and second inputs, but to deactivate the second and fourth transistors during single-ended mode of operation when the first and third transistors amplify a signal on the first input as single-ended input.

5. The apparatus of claim 4 wherein the four transistors, inductive load and the first switch form a low noise amplifier (LNA) of a receiver.

6. The apparatus of claim 5 further comprising a second switch coupled between a voltage source and the second terminal of the inductive load and a third switch coupled between the voltage source and a tap terminal of the inductive load, in which the tap terminal taps to a portion of the inductive load between the first and second terminals, wherein the second switch is open and the third switch is closed during the differential mode of operation and wherein the second switch is closed and the third switch is open during the single-ended mode of operation.

7. The apparatus of claim 5 further comprising a second switch coupled between a voltage source and the second terminal of the inductive load and a third switch coupled between the voltage source and a tap terminal of the inductive load, in which the tap terminal taps to a portion of the inductive load between the first and second terminals, wherein the second switch is open and the third switch is closed during the differential mode of operation and wherein the second switch is closed and the third switch is closed during the single-ended mode of operation.

8. The apparatus of claim 5 further comprising a second switch coupled between a voltage source and the second terminal of the inductive load and a third switch coupled between the voltage source and a tap terminal of the inductive load, in which the tap terminal taps to a portion of the inductive load between the first and second terminals, wherein the second switch is open and the third switch is closed during the differential mode of operation, wherein the second switch is closed and the third switch is closed during a first single-ended mode of operation, and wherein the second switch is closed and the third switch is open during a second single-ended mode of operation.

9. The apparatus of claim 5 wherein the LNA is to receive DVB-H transmitted signals.

10. The apparatus of claim 5 wherein the first, second and third switches are controlled by a programmable control signal.

11. The apparatus of claim 5 further including a fifth transistor coupled between the first transistor and the supply source and a sixth transistor coupled between the second transistor, in which gates of the fifth and sixth transistors are coupled to a gain control voltage to control current flow through the first, second, third, fourth, fifth and sixth transistors to control gain of the LNA.

12. The apparatus of claim 5 wherein when the first and second inputs are coupled to separate first and second antennas, first and third transistors are active to amplify the first signal from the first antenna as a first single-ended signal and the second and fourth transistors are active to amplify the second signal from the second antenna as a second single-ended signal.

13. A method comprising:
selecting a mode of operation between differential amplification and single-ended amplification for a same low-noise amplifier (LNA) in a receiver; and
switching between the two modes of operation based on a control signal for the LNA to amplify signal inputs on a pair of input lines to the LNA, wherein the switching between the two modes is controlled by a programmable control signal to programmably select between the differential amplification and the single-ended amplification dynamically during use, in which the single-ended amplification is used for power conservation and the differential amplification is used for higher performance.

14. The method of claim 13 wherein selecting includes selecting among a differential mode of operation and more than one mode of single-ended operation.

15. The method claim 13 wherein the LNA is to receive DVB-H transmitted signals.

* * * * *